(12) United States Patent
Okada

(10) Patent No.: US 9,476,978 B2
(45) Date of Patent: Oct. 25, 2016

(54) PHOTOSENSOR UNIT

(71) Applicant: Alpha Corporation, Yokohama-shi, Kanagawa (JP)

(72) Inventor: Takahiro Okada, Yokohama (JP)

(73) Assignee: ALPHA CORPORATION, Kanagawa (JP)

( * ) Notice: Subject to any disclaimer, the term of this patent is extended or adjusted under 35 U.S.C. 154(b) by 91 days.

(21) Appl. No.: 14/435,478

(22) PCT Filed: Nov. 29, 2013

(86) PCT No.: PCT/JP2013/082175
§ 371 (c)(1),
(2) Date: Apr. 14, 2015

(87) PCT Pub. No.: WO2014/097858
PCT Pub. Date: Jun. 26, 2014

(65) Prior Publication Data
US 2015/0331106 A1    Nov. 19, 2015

(30) Foreign Application Priority Data

Dec. 20, 2012 (JP) ................................ 2012-277826

(51) Int. Cl.
 *H01J 3/14* (2006.01)
 *G01S 17/02* (2006.01)
(Continued)

(52) U.S. Cl.
CPC ............ *G01S 17/026* (2013.01); *G01J 1/0271* (2013.01); *G01J 1/06* (2013.01); *G01S 7/4813* (2013.01); *H01L 31/16* (2013.01); *B60J 5/00* (2013.01)

(58) Field of Classification Search
CPC ................................ G01S 17/026; G01J 1/06
USPC ................................ 250/216, 221, 551, 239
See application file for complete search history.

(56) References Cited

U.S. PATENT DOCUMENTS

2005/0003323 A1*   1/2005   Katsuda ............. A61B 1/00089
                                                        433/29
2007/0272882 A1   11/2007   Ishihara et al.

FOREIGN PATENT DOCUMENTS

EP    2 124 263 A2   11/2009
JP    05-014045 A    1/1993
(Continued)

OTHER PUBLICATIONS

Official Communication issued in International Patent Application No. PCT/JP2013/082175, mailed on Jan. 7, 2014.
(Continued)

*Primary Examiner* — Thanh Luu
(74) *Attorney, Agent, or Firm* — Keating and Bennett, LLP

(57) ABSTRACT

An object of the present invention is to provide a photosensor unit with a structure which is simple and does not lower the detection accuracy. Provided is a photosensor unit configured such that reflected light of detection light emitted from one or more light emitting elements 2 housed in a unit case 1 to the outside of the unit case 1 is detected with a light receiving element 4 mounted on a mounting board 3, the reflected light being reflected from a detection region set on the outside of the unit case 1. A passage space for the reflected light inside the unit case 1 is separated from the other space in the unit case 1 by a partition member 6 placed on the mounting board 3 with an annular packing 5 therebetween which surrounds the light receiving element 4 and is made of an elastic material. The partition member 6 is provided with a pressing wall 7 configured to come into pressure contact with the outer peripheral wall of the annular packing 5 when the partition member 6 is placed on the mounting board 3, and thereby apply pressure contact force to the annular packing 5 while dividing the pressure contact force in a radially compressing direction, the pressure contact force being force with which the annular packing 5 comes into contact with the mounting board 3.

5 Claims, 6 Drawing Sheets

(51) Int. Cl.
    *H01L 31/16*     (2006.01)
    *G01J 1/02*     (2006.01)
    *G01J 1/06*     (2006.01)
    *G01S 7/481*     (2006.01)
    *B60J 5/00*     (2006.01)

(56) References Cited

FOREIGN PATENT DOCUMENTS

| JP | 2007-13050 A | 1/2007 |
|---|---|---|
| JP | 2008-003075 A | 1/2008 |
| JP | 2009-088434 A | 4/2009 |
| JP | 2012-18110 A | 1/2012 |

OTHER PUBLICATIONS

Official Communication issued in corresponding European Patent Application No. 13865070.0, mailed on Aug. 20, 2015.

\* cited by examiner (a)

(b)

(c)

US 9,476,978 B2

PHOTOSENSOR UNIT

TECHNICAL FIELD

The present invention relates to a photosensor unit.

BACKGROUND ART

A photosensor unit described in Patent Document 1 has been known as a photosensor unit including a light emitting element and a light receiving element housed in a unit case.

In this conventional example, a light passage region for the light emitting element and a light passage region for the light receiving element are partitioned by a partition formed of a resin-made body in order to prevent interference between the light emitting element and the light receiving element.

PRIOR ART DOCUMENT

Patent Document

Patent Document 1: Japanese Patent Application Publication No. 2012-18110

SUMMARY OF THE INVENTION

Problems to be Solved by the Invention

Here, in the conventional example mentioned above, the partition is formed by molding or the like. Thus, there is a problem in that it takes time and effort to manufacture the photosensor unit. Meanwhile, this problem may be solved by attaching a partition member which has already been formed in a separate process. In this case, however, a problem arises in that light is likely to leak through the boundary with the partition member, thereby lowering the detection accuracy.

The present invention has been made in view of solving the above disadvantages, and an object thereof is to provide a photosensor unit with a structure which is simple and does not lower the detection accuracy.

Means for Solving the Problems

According to the present invention, the above object is achieved by providing a photosensor unit configured such that reflected light of detection light emitted from one or more light emitting elements 2 housed in a unit case 1 to an outside of the unit case 1 is detected with a light receiving element 4 mounted on a mounting board 3, the reflected light being reflected from a detection region set on the outside of the unit case 1, wherein a passage space for the reflected light inside the unit case 1 is separated from another space in the unit case 1 by a partition member 6 placed on the mounting board 3 with an annular packing 5 therebetween which surrounds the light receiving element 4, and the partition member 6 is provided with a pressing wall 7 configured to come into pressure contact with an outer peripheral wall of the annular packing 5 when the partition member 6 is placed on the mounting board 3, and thereby apply pressure contact force to the annular packing 5 while dividing the pressure contact force in a radially compressing direction, the pressure contact force being force with which the annular packing 5 comes into contact with the mounting board 3.

In the present invention, the partition member 6 is placed on the upper surface of the mounting board 3 on which the light receiving element 4 is mounted, and is fixed with appropriate means. The annular packing 5 is interposed at the boundary of the partition member 6 and the mounting board 3 in such a way as to surround the light receiving element 4, thereby completely preventing leakage of light through the boundary of the partition member 6 and the mounting board 3.

Thus, by simply placing the partition member 6, the passage for the light to be received can be shielded from the other region. Accordingly, it is possible to achieve both reduction of the assembly man-hours and performance improvement at the same time.

Moreover, the outer periphery of the annular packing 5 is pressed obliquely downward toward the center axis thereof by the pressing wall 7 of the partition member 6 when the partition member 6 is placed on to the mounting board 3. Thus, the pressing force applied when the partition member 6 is fixed acts as pressure contact force with the mounting board 3 while partly consumed as deformation force in the radially compressing direction. Accordingly, instead of using a special material, a general-purpose rubber, synthetic resin material, or the like can be used to lower the apparent elastic modulus.

With a low elastic modulus, the pressure contact force with the mounting board 3 will never be excessively large even when the amount of deformation of the annular packing 5 in the placing direction of the partition member 6 is large. Thus, it is possible to securely prevent defects such as disconnection of printed wirings due to warpage of the mounting board 3 resulting from the placing operation of the partition member 6. In addition, the amount of the deformation does not need to be strictly managed, specifically, the distance from the partition member 6, or the pressing wall 7 to be precise, to the mounting board 3 does not need to be maintained with excessively high accuracy. Accordingly, the yield and the manufacturing efficiency can be improved.

As the annular packing 5, an O-ring or the like is usable. However, in the case of making a photosensor unit in which the annular packing 5 is formed in such a tubular circular conical shape that inner and outer peripheral wall surfaces thereof gradually become smaller in diameter toward an upper side, the deformability in the radially compressing direction improves. Thus, the apparent elastic modulus can be lowered more efficiently.

Further, in the case where temporarily-holding fitting portions 8 are formed the annular packing 5 and the partition member 6, respectively, and configured to be press-fitted such that one of the temporarily-holding fitting portions 8 is press-fitted to the other, the partition member 6 can be fixed to the mounting board 3 once the annular packing 5 is attached to a bottom wall portion of the partition member 6. Thus, the assemblability can be improved.

A single light emitting element 2 may be housed in the unit case 1. However, by housing a plurality of light emitting elements 2, the amount of light to be emitted to the detection region can be increased. Thus, the detection accuracy can be enhanced.

In the case of making a photosensor unit in which a lens 12 is fixed to the unit case 1, a single convex lens surface 9 having an optical axis extending to the light receiving element 4 is formed on an object side of the lens 12, and a light-receiving convex lens surface 10 sharing the optical axis with the single convex lens surface 9, and light-emitting convex lens surfaces 11 having optical axes being in parallel with the optical axis of the light-receiving convex lens surface 10 and extending respectively to the light emitting elements 2 are integrally formed on an opposite side of the lens 12, the detection light from the light emitting element 2 can be condensed on the optical axis of the light receiving element 4 by simply fixing the lens 12 to the unit case 1. As a result, the detection region can be efficiently irradiated with the detection light. Thus, the detection accuracy can be enhanced.

Effect of the Invention

According to the present invention, the irradiation light from the light emitting element housed in the same unit case as the light receiving element can be prevented from leaking into the light receiving element, simply by placing and fixing the partition member onto the mounting board. Accordingly, the structure can be simple and the detection accuracy can be enhanced as well. Further, since the warpage and the like of the mounting board are securely prevented from occurring due to the pressure contact of the annular packing with the mounting board, no support or the like is required for preventing the warpage of the mounting board. Thus, the structure can be simple.

MODE FOR CARRYING OUT THE INVENTION

Figure 1:
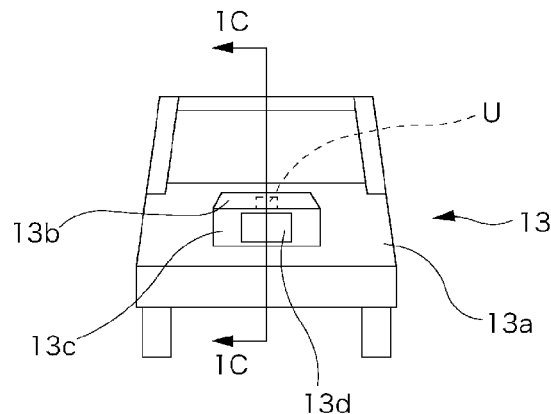
FIG. 1 shows a vehicle to which the present invention is applied, and part (a) is a view of the vehicle as seen from the rear, part (b) is a side view of the vehicle, and part (c) is a cross sectional view taken along line 1C-1C in part (a).
Figure 1:
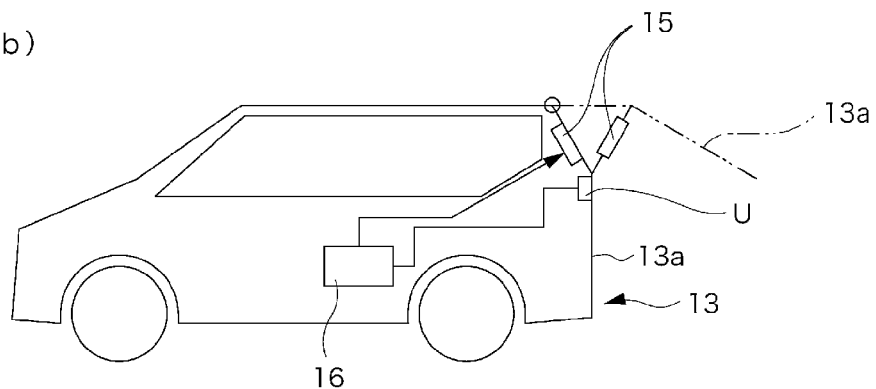
Figure 1:
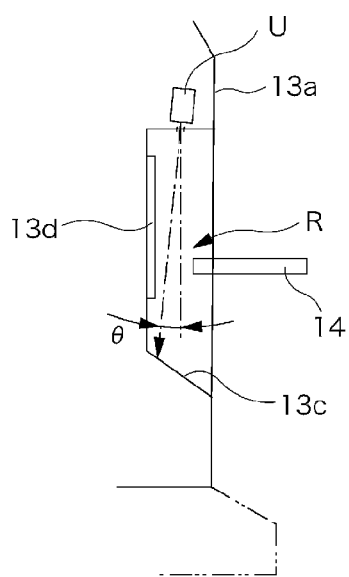

FIG. 1 shows a vehicle 13 to which the present invention is applied. In this example, a photosensor unit (U) is used to control opening-closing operations of a back door 13a of the vehicle, the photosensor unit (U) being fixed to the back door 13a.

As will be described later, the photosensor unit (U) is configured to output a detection signal when detecting that a detection object 14 enters a predetermined detection region (R) into which detection light is emitted. The photosensor unit (U) is fixed to an upper wall portion of a license-plate attaching recess 13c covered by a license-plate finisher 13b. Note that reference numeral 13d in FIG. 1 denotes a license plate.

Moreover, in this example, the optical axis of the detection light is inclined slightly toward to the inside of the vehicle (by an angle θ) so that the center of the detection region (R) of the photosensor unit (U) can be situated inside the license-plate attaching recess 13c. In this way, it is possible to prevent unnecessary reaction of the photosensor unit (U) to a person, animal, trash, or the like other than the user of the vehicle present near the vehicle, which would otherwise occur due to decrease in detection performance outside the license-plate attaching recess 13c.

When the photosensor unit (U) outputs a detection signal, first, preparatory operations are performed by a controlling unit 16 such as authentication of an electronic key the user has, detection of the state of the back door 13a, and a locking-unlocking operation, and then a driving device 15 is driven. The authentication of the electronic key is performed by authenticating an authentication code outputted by the electronic key through communication with an authentication device not shown. If the authentication is successful, the back door is unlocked on condition that the back door is closed, and the driving device 15 is then driven to start a door opening operation.

Thus, in this embodiment, even when the user's hands are full with luggage or the like, the user can open the back door only by moving the luggage or the like to the inside of the license-plate attaching recess 13c or the vicinity thereof which are set as the detection region (R). Accordingly, the convenience is improved.

Figure 2:
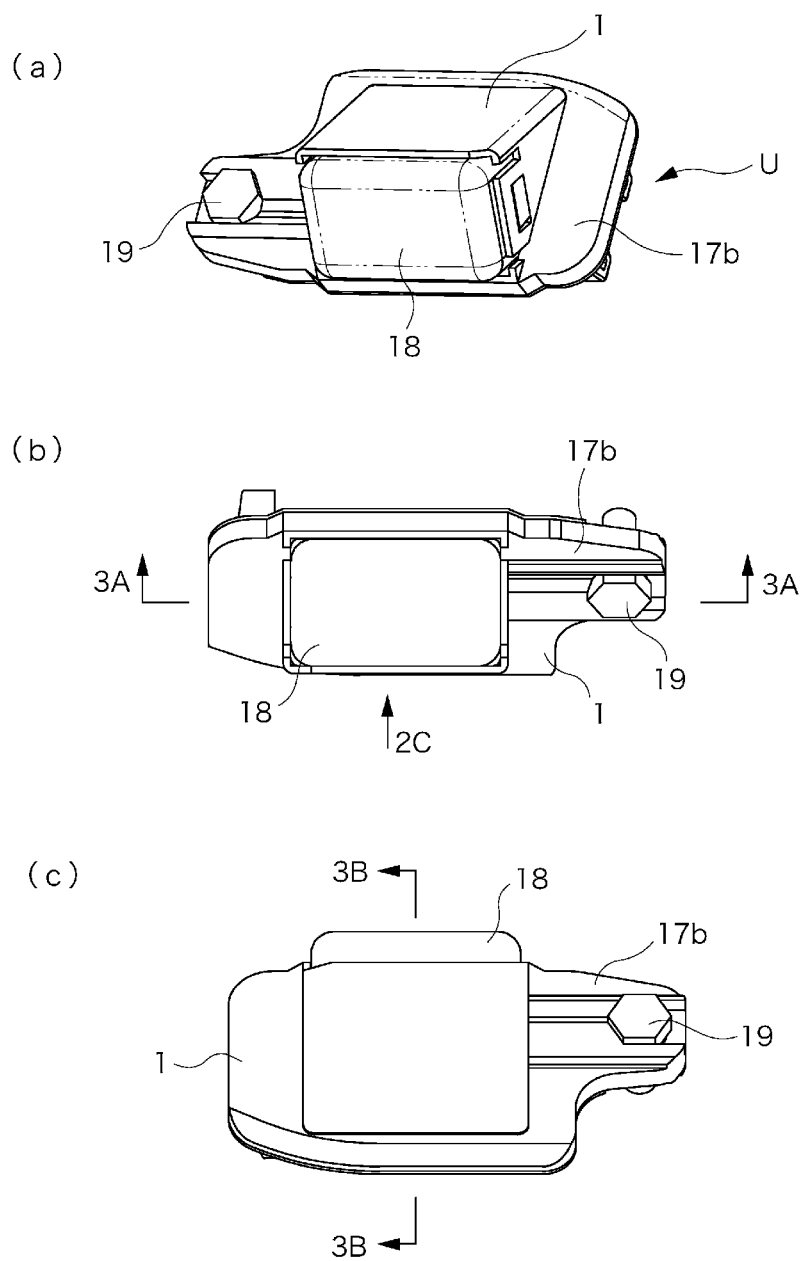
FIG. 2 is a set of views showing a photosensor unit, and part (a) is a perspective view as seen from a front side, part (b) is a front view, and part (c) is a view as seen in the direction of arrow 2C in part (b).

FIG. 2 and the subsequent drawings show the photosensor unit (U). The photosensor unit (U) includes, as its constituent components, a unit case 1 fixed to the vehicle, and light emitting elements 2 and a light receiving element 4 mounted on a mounting board 3 and housed in the unit case 1.

The unit case 1 includes: a bracket 17 including a tube portion 17a and a fixing flange 17b to be fixed to the vehicle protruding from the sidewall of the tube portion 17a; an inner case 18 fixed to the tube portion 17a of the bracket 17; and a lid member 22 closing a rear opening portion of the bracket 17. The unit case 1 is fixed to the back door 13a with a bolt 19 penetrating through the fixing flange 17b. A packing 20 is interposed between the fixing flange 17b and a panel.

Meanwhile, with a transparent synthetic resin material, the inner case 18 is formed in a tubular shape with one end closed, and is attached to the bracket 17 by inserting its open end into a front end opening of the bracket 17. The inner case 18 is provided with hook-shaped protrusions 18a on its sidewall while the bracket 17 is provided with locking openings 17c configured to lock the protrusions 18a so that the inner case 18 can be held inside the bracket 17 (see FIG. 4).

Infrared LEDs configured to emit invisible light pulses such as infrared rays are used as the light emitting elements 2 while a photodiode is used as the light receiving element 4. These light emitting elements 2 and light receiving element 4 are mounted on the surface of the same mounting board 3.

Figure 3:
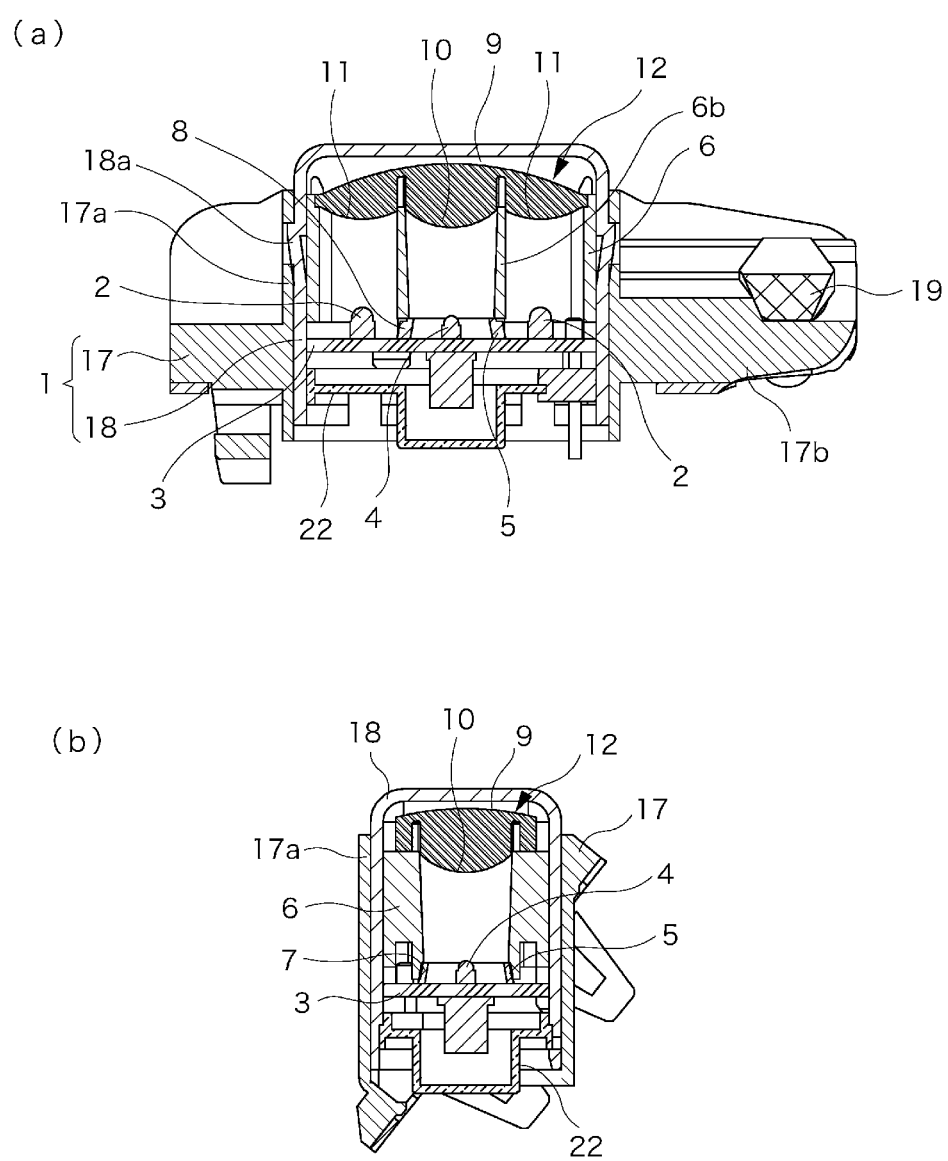
FIG. 3 is a set of cross-sectional views, and part (a) is a cross-sectional view taken along line 3A-3A in part (b) of FIG. 2, and part (b) is a cross-sectional view taken along line 3B-3B in part (c) of FIG. 2.
Figure 4:
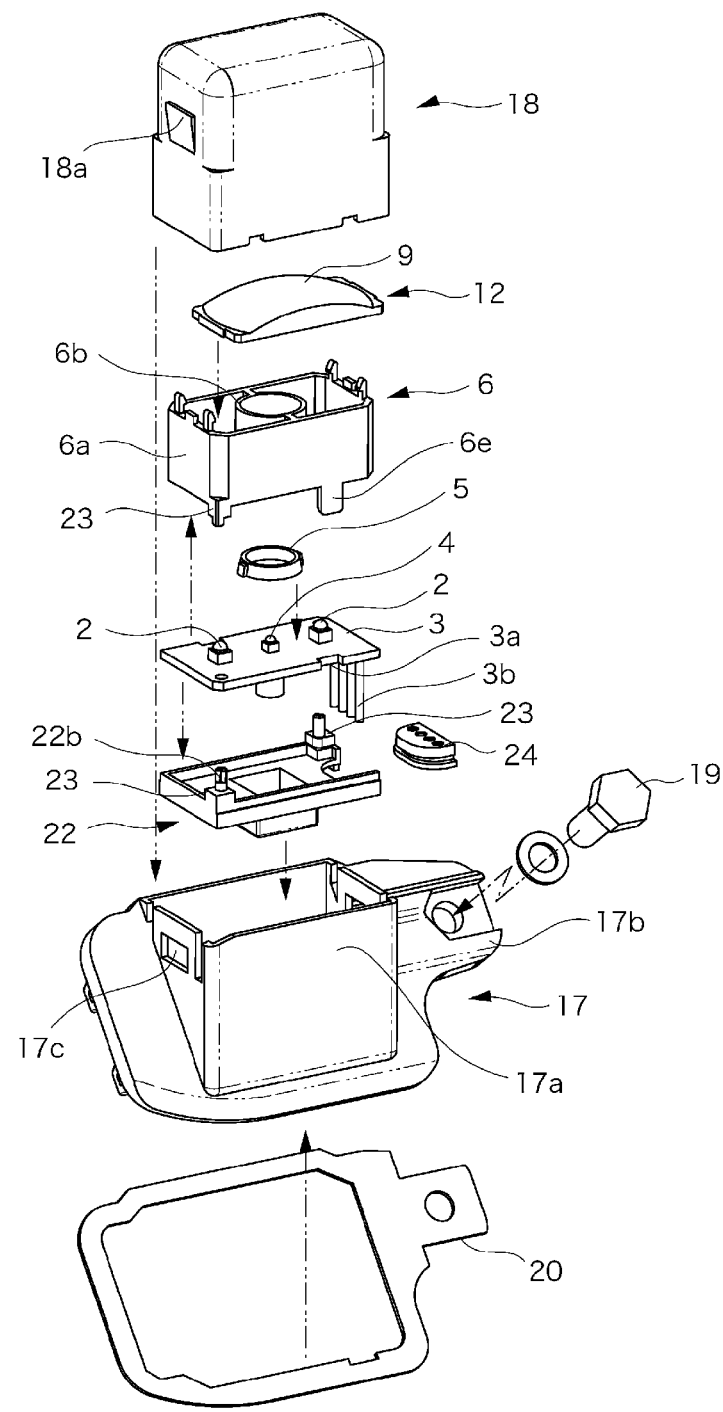
FIG. 4 is an exploded perspective view of the photosensor unit.

As shown in FIGS. 3 and 4, the mounting board 3 is formed in a rectangular shape, and one light receiving element 4 is disposed on a center portion of the mounting board 3 while two light emitting elements 2 are disposed at positions spaced by the same distance from the light receiving element 4 situated at the center.

A partition member 6 is attached inside the unit case 1 to prevent irradiation light (detection light) from the light emitting elements 2 from directly entering the light receiving element 4.

Figure 5:
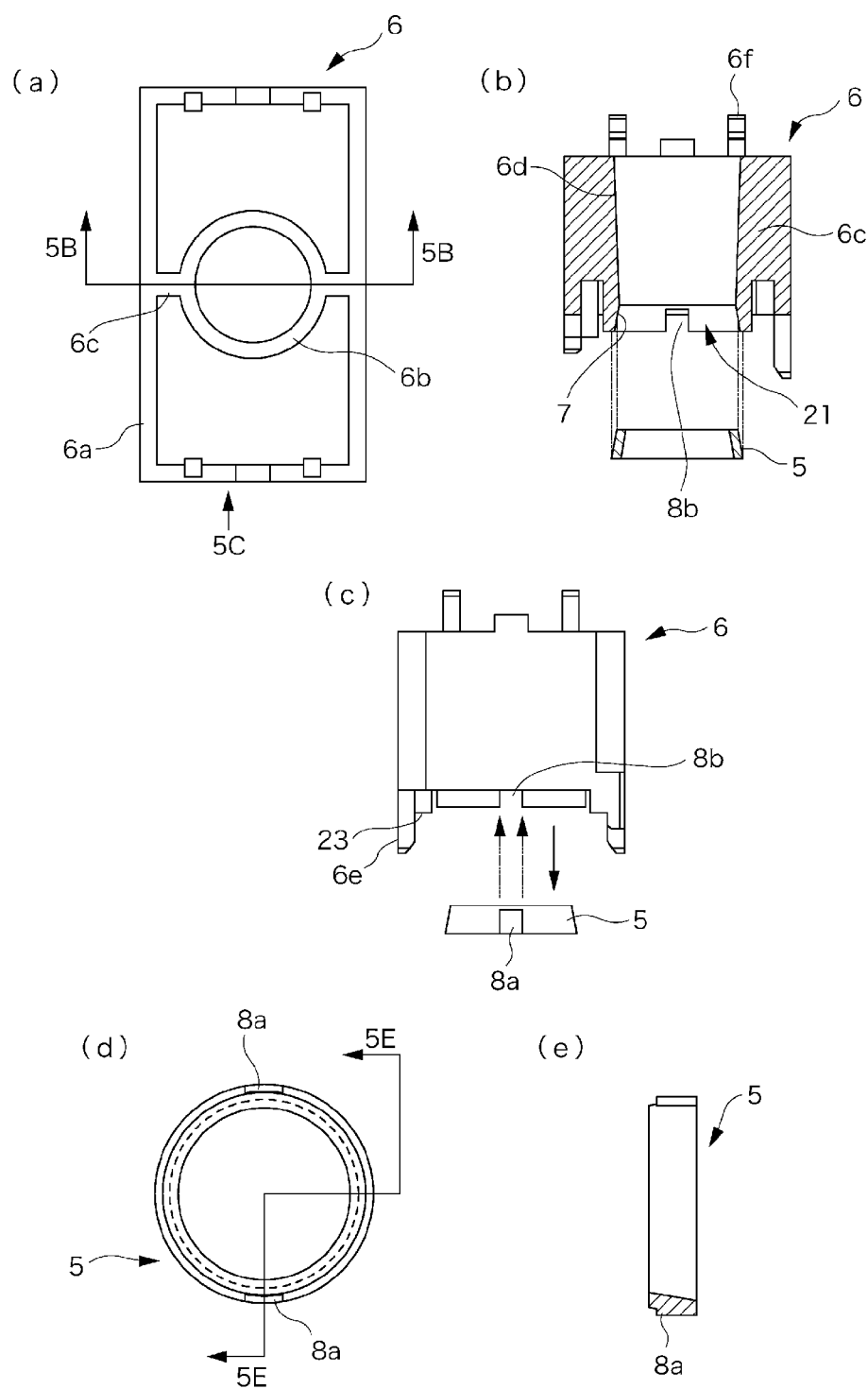
FIG. 5 is a set of views showing the main part of the present invention, and part (a) is a plan view of a partition member, part (b) is a cross-sectional view taken along line 5B-5B in part (a), part (c) is a view as seen in the direction of arrow 5C in part (a), part (d) is a plan view of an annular packing, and part (e) is a cross-sectional view taken along line 5E-5E in part (d).

As shown in FIG. 5, the partition member 6 made of an opaque synthetic resin material includes: a rectangular frame portion 6a whose outer periphery substantially coincides with the outer periphery of the mounting board 3; a shield tube portion 6b disposed in the center of the rectangular frame portion 6a and having a tubular shape opened on the upper and lower sides; and separating walls 6c connecting the shield tube portion 6b to the rectangular frame portion 6a.

As shown in FIG. 3, the mounting board 3 is attached to the partition member 6. In this state, a region around the light receiving element 4 is surrounded by the shield tube portion 6b and is therefore separated from the other space inside the unit case 1 as a passage space for reflected light from the detection object 14 in the detection region (R). As shown in part (b) of FIG. 5, on the inner peripheral wall surface of the shield tube portion 6b, a tapered portion 6d is formed which gradually becomes larger in diameter toward the upper side from the mounting board 3 on which the light receiving element 4 is mounted. In this way, the efficiency of condensation of the reflected light by the mirror effect on the inner wall of the shield tube portion 6b is improved.

Moreover, the space inside the rectangular frame portion 6a of the partition member 6 excluding the shield tube portion 6b is separated by the partition walls 6c and used as passage spaces for the detection light emitted from the light emitting elements 2. In this example, two passage spaces are formed for the detection light to match the number of the light emitting elements 2, and each light emitting element 2 is disposed in a center portion of its passage space.

Further, as shown in FIG. 5, a packing attaching portion 21 is formed at the lower end surface of the shield tube portion 6b. The inner peripheral wall surface of the packing attaching portion 21 has a pressing wall 7 formed by a circular conical surface which gradually becomes larger in diameter toward the lower side. An annular packing 5 made of an opaque synthetic resin material having adequate elasticity is attached to the packing attaching portion 21.

The annular packing 5 is formed in such a tubular circular conical shape that the thickness remains substantially constant and the outer peripheral wall is formed by substantially the same circular conical surface as the peripheral wall of the pressing wall 7.

This annular packing 5 is provided with temporarily-holding protrusions 8a bulging from the sidewall thereof. The annular packing 5 is coupled to the packing attaching portion 21 through temporarily-holding fitting portions 8 formed by press-fitting the temporarily-holding protrusions 8a into temporarily-holding recesses 8b formed by cutting out part of the peripheral wall of the packing attaching portion 21. In the state where the annular packing 5 is attached to the partition member 6, a lower end portion of the annular packing 5 protrudes from the lower end of the packing attaching portion 21, thereby providing a necessary allowance for deformation.

The partition member 6 and the mounting board 3 are sub-assembled in advance onto the lid member 22 with a later-described lens 12 coupled to the partition member 6 and are mounted in the bracket 17.

The lid member 22 is coupled to the partition member 6 while sandwiching the mounting board 3 in cooperation with the partition member 6. The partition member 6 and the lid member 22 are coupled by press-fitting coupling legs 22b protruding from the lid member 22 and penetrating through corners of the mounting board 3, into press-fitting holes in the partition member 6.

As shown in FIG. 4, to restrict displacement of the attached position of the mounting board 3, the partition member 6 and the lid member 22 are provided with pressing protrusions 23 configured to come into contact with the corners of the mounting board 3 to vertically sandwich the mounting board 3, and the partition member 6 is also provided with positioning pieces 6e configured to be fitted in recesses 3a formed by cutting the mounting board 3 to thereby position the mounting board 3.

When the partition member 6 is pressed against the mounting board 3 for coupling the partition member 6 to the lid member 22, the outer periphery of the annular packing 5 is pressed obliquely downward toward the center axis thereof by the pressing wall 7 of the partition member 6. As a result, the annular packing 5 presses the lower side, i.e. the mounting board 3 while being deformed in a radially compressing direction in which the annular packing 5 becomes smaller in diameter, and also come into tight contact with the pressing wall 7 at the outer peripheral wall surface. Thus, the annular packing 5 prevents formation of a gap at the boundary portion of the annular packing 5 and the mounting board 3 and at the boundary portion of the annular packing 5 and the pressing wall 7. Accordingly, leakage of light through these boundary portions can be prevented completely.

The partition member 6, the mounting board 3, and the lid member 22 coupled to each other as described above are fixed such that the lid member 22 closes a lower opening portion of the bracket 17. Then, the boundary portion of the lid member 22 and the bracket 17 is tightly closed with a sealing resin or the like. At the time of the fixing to the bracket 17, a harness holder 24 in which to insert a harness 3b coming out from the mounting board 3 is fixed to the lid member 22.

Meanwhile, the lens 12 is fixed to the upper end of the partition member 6. In order to fix the lens 12, locking hooks 6f configured to lock and hold the lens 12 protrude from the upper end surface of the partition member 6.

Figure 6:
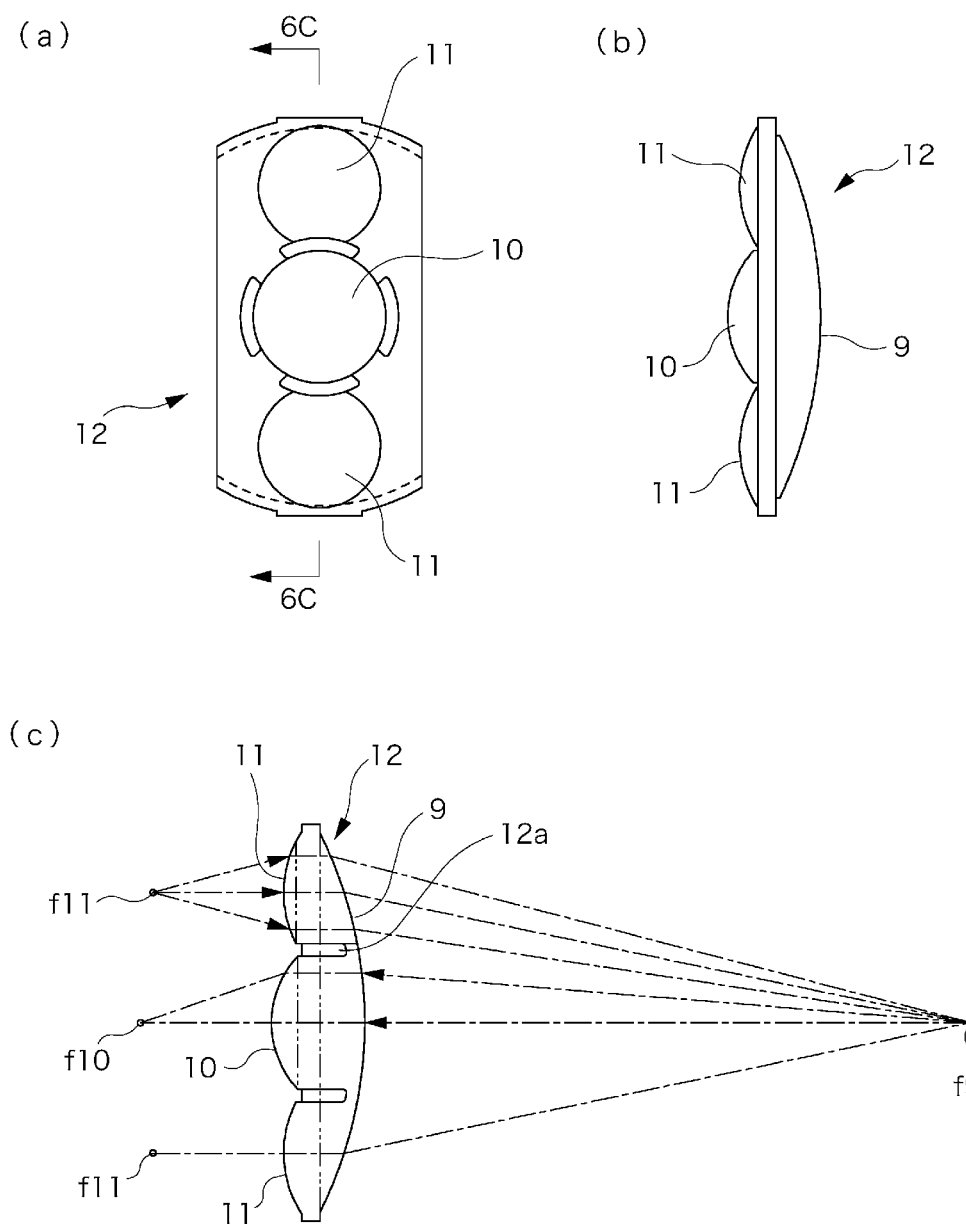
FIG. 6 is a set of views showing a lens, and part (a) is a plan view, part (b) is a side view, and part (c) is a cross-sectional view taken along line 6C-6C in part (a).

As shown in FIG. 6, the lens 12 is formed from an acrylic resin in a substantially rectangular shape in a plan view. It has a single convex lens surface 9 over the substantially entire surface on the upper side (object side) and has one light-receiving convex lens surface 10 and two light-emitting convex lens surfaces 11 on the opposite side (light-source side).

Each of the convex lens surfaces 9, 10, and 11 is formed by a spherical surface. The light-receiving convex lens surface 10 has a diameter substantially equal to the inner diameter of the shield tube portion 6b of the partition member 6 and is disposed at the center of the lens 12. This light-receiving convex lens surface 10 and the single convex lens surface 9 are situated in such a way as to share a rotation axis about which their spherical surfaces are defined by rotation. These single convex lens surface 9 and light-receiving convex lens surface 10 are attached by being positioned such that the above-mentioned shared rotation axis which serves as an optical path in the case where the single convex lens surface 9 and the light-receiving convex lens surface 10 are each a plano-convex lens, coincides with the center axis of the shield tube portion 6b of the partition member 6.

On the other hand, each light-emitting convex lens surface 11 is formed such that the optical axis thereof is in parallel with the optical axis of the light-receiving convex lens surface 10 and the diameter thereof is substantially equal to the length of one side of a section separated by the separating walls 6c of the partition member 6, and is disposed such that one light emitting element 2 is located on each optical axis. A groove 12*a* is formed at the boundary portion of the light-emitting convex lens surface 11 and the light-receiving convex lens surface 10 and prevents irradiation light introduced from the light-emitting convex lens surface 11 from entering the region of the light-receiving convex lens surface 10.

Thus, in this embodiment, with the light emitting element 2 situated at the front focal point position (f11) of the light-emitting convex lens surface 11, the irradiation light from the light emitting element 2 is converted into parallel light by the light-emitting convex lens surface 11, travels through the lens 12, and is then condensed by the single convex lens surface 9 at the rear focal point position (f9) of the single convex lens surface 9.

Thus, by setting the detection region (R) near the rear focal point position (f9) of the single convex lens surface 9 in a state where the photosensor unit (U) is fixed, the amount of detection light in the detection region (R) can be increased. In addition, light reflected from the detection object 14 is condensed by the single convex lens surface 9 and the light-receiving convex lens surface 10 and thereby efficiently delivered to the light receiving element 4 disposed at the focal point position (f10) of the light-receiving convex lens surface 10. Accordingly, high detection accuracy can be achieved.

EXPLANATION OF REFERENCE NUMERALS

1 UNIT CASE
2 LIGHT EMITTING ELEMENT
3 MOUNTING BOARD
4 LIGHT RECEIVING ELEMENT
5 ANNULAR PACKING
6 PARTITION MEMBER
7 PRESSING WALL
8 TEMPORARILY-HOLDING FITTING PORTION
9 SINGLE CONVEX LENS SURFACE
10 LIGHT-RECEIVING CONVEX LENS SURFACE
11 LIGHT-EMITTING CONVEX LENS SURFACE
12 LENS

The invention claimed is:

1. A photosensor unit configured such that reflected light of detection light emitted from one or more light emitting elements housed in a unit case to an outside of the unit case is detected with a light receiving element mounted on a mounting board, the reflected light being reflected from a detection region set on the outside of the unit case, wherein
 a passage space for the reflected light inside the unit case is separated from another space in the unit case by a partition member placed on the mounting board with an annular packing therebetween which surrounds the light receiving element and is made of an elastic material, and
 the partition member is provided with a pressing wall configured to come into pressure contact with an outer peripheral wall of the annular packing when the partition member is placed on the mounting board, and thereby apply pressure contact force to the annular packing while dividing the pressure contact force in a radially compressing direction, the pressure contact force being force with which the annular packing comes into contact with the mounting board.

2. The photosensor unit according to claim 1, wherein the annular packing is formed in such a tubular circular conical shape that inner and outer peripheral wall surfaces thereof gradually become smaller in diameter toward an upper side.

3. The photosensor unit according to claim 1, wherein temporarily-holding fitting portions are formed on the annular packing and the partition member, respectively, and configured such that one of the temporarily-holding fitting portions is press-fitted to the other.

4. The photosensor unit according to claim 1, wherein the plurality of light emitting elements are housed in the unit case in such a way as to surround the light receiving element.

5. The photosensor unit according to claim 1, wherein
 a lens is fixed to the unit case,
 a single convex lens surface having an optical axis extending to the light receiving element is formed on an object side of the lens, and
 a light-receiving convex lens surface sharing the optical axis with the single convex lens surface, and light-emitting convex lens surfaces having optical axes being in parallel with the optical axis of the light-receiving convex lens surface and extending respectively to the light emitting elements are integrally formed on an opposite side of the lens.

* * * * *